United States Patent [19]

Canepa

[11] Patent Number: 4,685,084

[45] Date of Patent: Aug. 4, 1987

[54] APPARATUS FOR SELECTING ALTERNATE ADDRESSING MODE AND READ-ONLY MEMORY

[75] Inventor: George R. Canepa, Orangevale, Calif.

[73] Assignee: Intel Corporation, Santa Clara, Calif.

[21] Appl. No.: 742,459

[22] Filed: Jun. 7, 1985

[51] Int. Cl.[4] .............................................. G11C 13/00
[52] U.S. Cl. ..................................... 365/189; 365/230
[58] Field of Search ........................ 365/189, 230, 178

[56] References Cited

U.S. PATENT DOCUMENTS 4,594,690 6/1986 Meyers et al. ....................... 365/189

FOREIGN PATENT DOCUMENTS 2101372B 1/1983 United Kingdom ................ 365/189

Primary Examiner—Terrell W. Fears
Attorney, Agent, or Firm—Blakely, Sokoloff, Taylor & Zafman

[57] ABSTRACT

An EPROM which includes on-chip circuitry for selecting alternate addressing. An EPROM cell, separate from the memory's array, is programmed to convert the memory to the alternate page mode addressing. The selection of the pages is done through the data lines. This frees address lines when the alternate mode is selected.

10 Claims, 6 Drawing Figures

Fig. 2 LATCH CIRCUIT

WRITE ENABLE BUFFER

PAGE MODE BIT STORAGE
AND
SIGNAL GENERATOR

LATCH CLEAR CIRCUIT

APPARATUS FOR SELECTING ALTERNATE ADDRESSING MODE AND READ-ONLY MEMORY

BACKGROUND OF THE INVENTION

1. Field of the Invention

The invention relates to the field of memory accessing, particularly memory accessing with a limited address space.

2. Prior Art

Many methods are known for using address signals from a processor to access memory. In some of these methods, a limited address space is used to access memory having a greater capacity than that defined by the address space. One example of this is bank switching; this permits the limited address space to access two or more banks of memory. The processor under program control selects an appropriate bank, for instance, by enabling one memory bank rather than the other.

The present invention provides an apparatus for permitting an integrated circuit read-only memory (ROM) to be programmed to operate in one of two addressing modes. In one mode the memory operates as an ordinary ROM. In the other mode not all of the address lines are used, thereby freeing address space to access other memory. In effect, in this mode paging occurs within the ROM to permit access to the entire contents of the ROM. Importantly, this is accomplished without additional pins or terminals on the ROM.

SUMMARY OF THE INVENTION

An improvement in an integrated circuit read-only memory having n address lines for accessing p words is disclosed. In one mode the n address lines select the p words in the memory in an ordinary manner. The improvement permits an alternate page addressing mode. The improvement includes programmable selection means for selecting the alternate addressing mode and storage means for storing at least one signal. At least one address buffer has its output controlled by the contents of the storage means when the alternate addressing mode is selected. In this manner, all p words in memory may be selected with less than n address signals. In the preferred embodiment, address signals themselves are not required to select the different pages in memory. Rather, the different pages are selected through data lines.

DETAILED DESCRIPTION OF THE INVENTION

An improved memory addressing apparatus is disclosed which permits a read-only memory to be used in an alternate page mode. In the following description numerous specific details are set forth such as specific address lines. It will be obvious to one skilled in the art that the present invention may be practiced without these specific details.

As currently implemented, the present invention is used in an electrically programmable read-only memory (EPROM). This memory is fabricated using known metal-oxide-semiconductor (MOS) processing. The memory cells comprise floating gate devices which are programmed by the channelling of electrons onto a floating gate. These devices are erased by exposing the memory to radiation such as ultraviolet radiation. EPROM cells are disclosed in U.S. Pat. No. 4,412,310. As currently realized, the invention is integrally formed as part of a 512K EPROM which is organized as a 64K×8 memory. Sixteen address lines (A0–A15) are used to access the 64K 8-bit words in an ordinary manner in one addressing mode.

Many microprocessors such as the Intel 8085 have a limited address space, for instance, 16 bits. All 16 bits of this address space are required to access the 64K 8-bit words in the 512K EPROM. With the present invention, this EPROM's organization is selectively changed to four 16K×8 arrays. In this organization, the entire memory is accessed in a page mode with different pages being selected through the data lines. This frees two address lines for use elsewhere, such as for a RAM if the automatic addressing mode is used.

Figure 1:
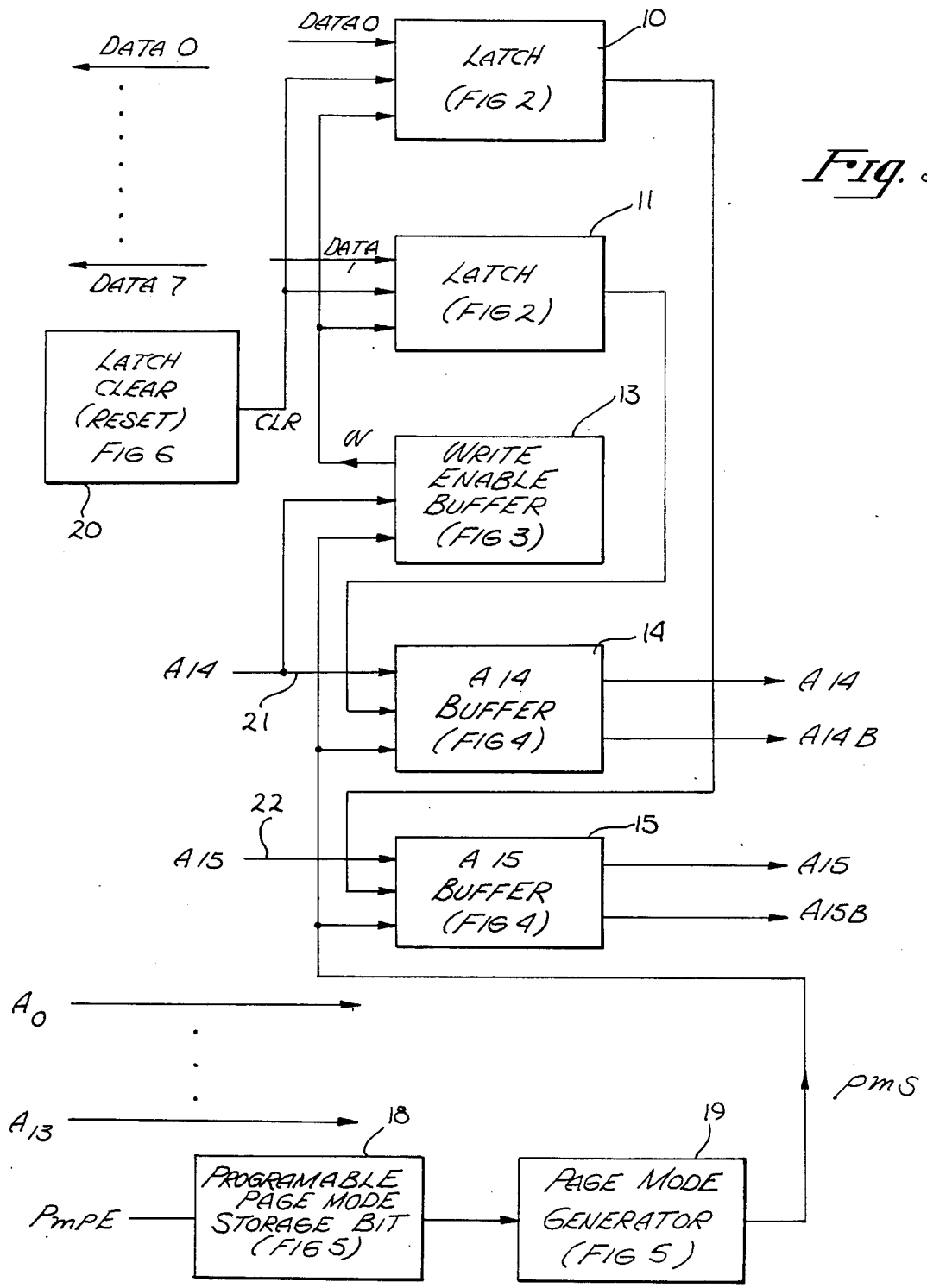
FIG. 1 is an overall block diagram of the present invention.

Referring now to FIG. 1, the memory includes data lines, data 0 through data 7. The contents of the memory are read at the terminals for these lines in an ordinary manner. With the present invention, two of these terminals, data lines 0 and 1, are coupled to latches 10 and 11, respectively.

The memory, as mentioned, requires 16 address signals, A0 through A15 to access all 64K words for ordinary addressing. With the present invention, two of these lines are coupled to special address buffers. Specifically, line 21 (A14) is coupled to buffer 14, and line 22 (A15), is coupled to buffer 15. During ordinary memory operation (when the page mode is not selected), these buffers simply buffer the address signals on lines 21 and 22 and additionally, provide the complement of the address signals at the buffers' output.

The present invention also employs a "write" enable buffer 13. This buffer receives two inputs which enable the buffer; specifically, the PMS signal and the signal on line 21 enable this buffer. With buffer 13 enabled the W signal (a strobe signal) is coupled to latches 10 and 11, allowing these latches to load the data bits 0 and 1, respectively. While, as illustrated in FIG. 1, one of the enable signals to buffer 13 is provided on line 21, this signal may be provided through other lines. For example, many EPROMs have a pin configuration resembling the pin configuration for RAMs. The write enable pin for the RAMs does not have a corresponding use on the EPROMs. This unused pin may be coupled to the write enable buffer 13 to provide the enable signal.

The present invention employs a programmable storage means 18 for storing a single bit. In the presently preferred embodiment, an EPROM cell is used. The state of this bit determines if the page mode is selected. When the page mode is selected, the page mode generator 19 provides a signal (PMS) to the buffers 13, 14 and 15.

A latch clear circuit 20 provides a signal to latches 10 and 11 when power is applied to the memory. This signal causes these latches to latch in a predetermined state.

In normal operation (non-page mode), as mentioned, the address signals A14 and A15 are processed by buffers 14 and 15 in an ordinary manner and the memory is addressed by all the address signals A0 through A15. The inputs to the buffers 14 and 15 from the latches 11 and 12 are ignored by the buffers. Also since the PMS signal is low, the write enable buffer 13 is not enabled, and latches 10 and 11 ignore the data bits 0 and 1.

When the programmable storage bit 18 is programmed for the page mode, the generator 19 provides a high page mode select (PMS) signal. Buffers 14 and 15 then ignore the signals on lines 20 and 21. The output of these buffers is controlled by the state of the latches 11 and 10.

The PMS signal causes buffer 13 to provide the W signal when a signal is present on line 21. The W signal, in turn, causes the latches 10 and 11 to record, or store the data on bits 0 and 1, respectively.

When the page mode is selected and the memory is powered up, the latch clear circuit 20 causes latches 10 and 11 to assume predetermined states. Assume for purposes of discussion that both these latches provide low signals at their outputs at power up. When the memory is enabled the output of buffers 14 and 15 are low since the output of latches 11 and 10, respectively are low. The address signals on lines A0 through A13 are able to access page 1 of the memory. When another page is to be accessed, a signal is applied to line 21 simultaneously with the application of signals to the data lines 0 and 1. This sets one or both of the latches 10 and 11 to another state and, for instance, provides a high output from latch 10 and a low output from latch 11. This will cause the output of buffer 15 to be high, while the output of buffer 14 remains low. In this state, a second page of the memory is now accessed by the address signals, A0 through A13. Similarly, each of the four "arrays" of the memory may be selected in the page mode.

It is important to note that with the present invention the different pages are selected through signals on the data lines. No additional pins are required to the EPROM for the page mode, either to select the page mode itself or to select the different pages once th page mode is selected.

LATCH CIRCUIT

Figure 2:
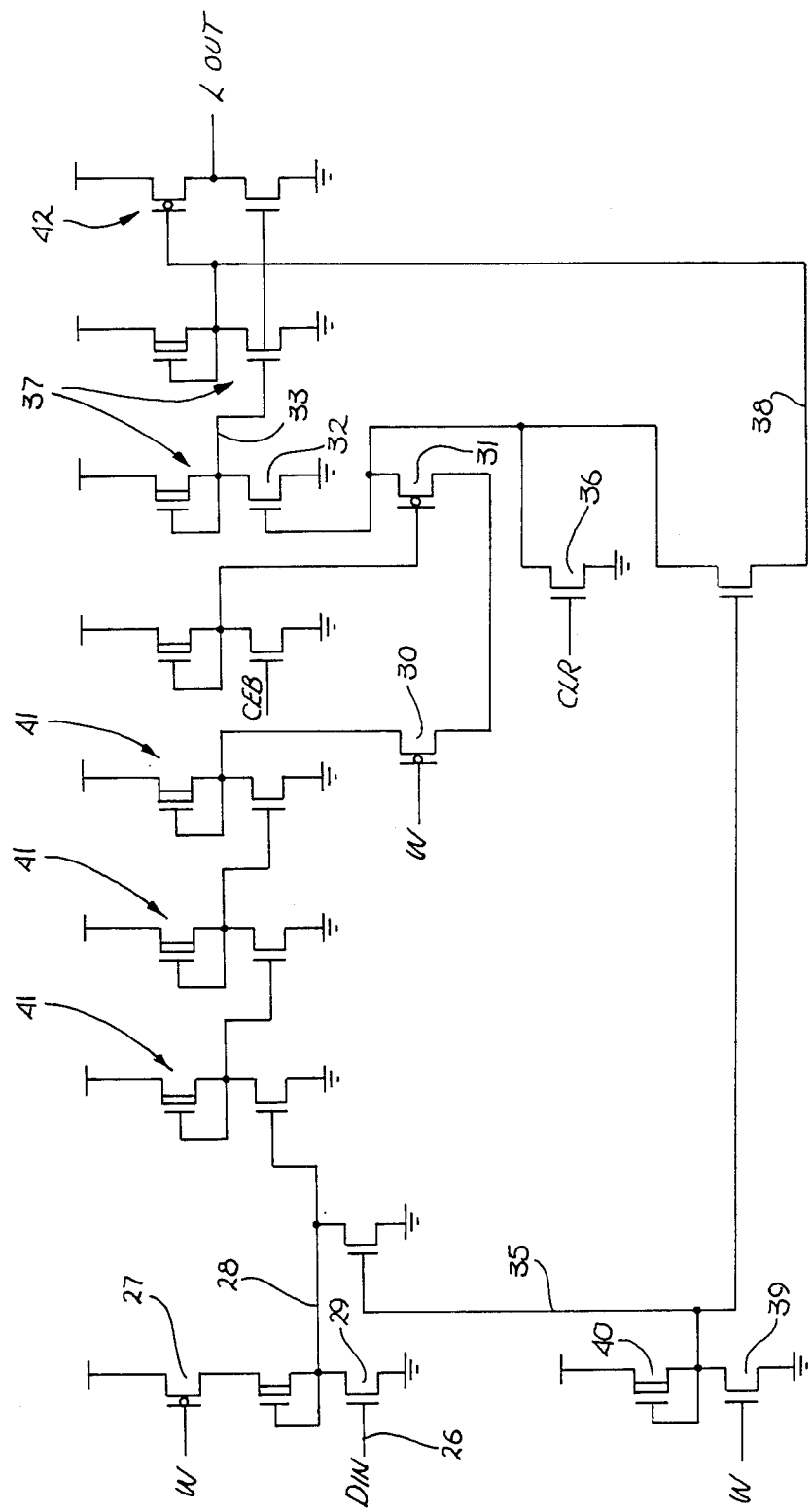
FIG. 2 is an electrical schematic of the latch circuit of FIG. 1.

In FIG. 2, the latch circuit receives the W (strobe) signal at the gates of transistors 27, 30 and 39. (The small 0 under the gate of transistors 27 and 30 indicates that these transistors have a threshold voltage of approximately 0 volts.) The data line 26 (e.g., for data bit 0 or 1 of FIG. 1) is coupled to the gate of an enhancement mode transistor 29. The clear signal from the latch clear circuit 20 of FIG. 1 is coupled to the gate of transistor 36. The output of the latch (LOUT) is determined by the state of latch 37 and this state is buffered through buffer stage 42.

When the W signal is not present, line 35 is coupled to the power supply potential (e.g., five volts) through transistor 40. This causes line 28 to be coupled to ground and prevents any signal on the data line 26 from being coupled into the inverters 41. Also, since transistor 30 does not conduct during this period of time, the signal path to the gate of transistor 32 is interrupted even if the memory is selected. When the memory is selected, the complement of the chip enable (CEB) signal is low which causes transistor 31 to conduct. Therefore, the state of the latch 37 cannot be changed.

On power up, transistor 36 momentarily conducts causing transistor 32 to cease conducting. This causes line 33 to be brought to the power supply potential setting the latch such that its output is low at the output stage 42.

When the W signal is present, the path through line 38 is broken since transistor 39 conducts. The signal at line 26 is also allowed to flow from transistor 29 through line 28 (since line 35 is low), to the inverter stages 41. This "data" signal flows through transistor 30 and then, finally, through transistor 31 assuming the chip is selected. The signal sets the latch 37 at the gate of transistor 32. When the W signal drops in potential, the latch remains set.

WRITE ENABLE BUFFER

Figure 3:
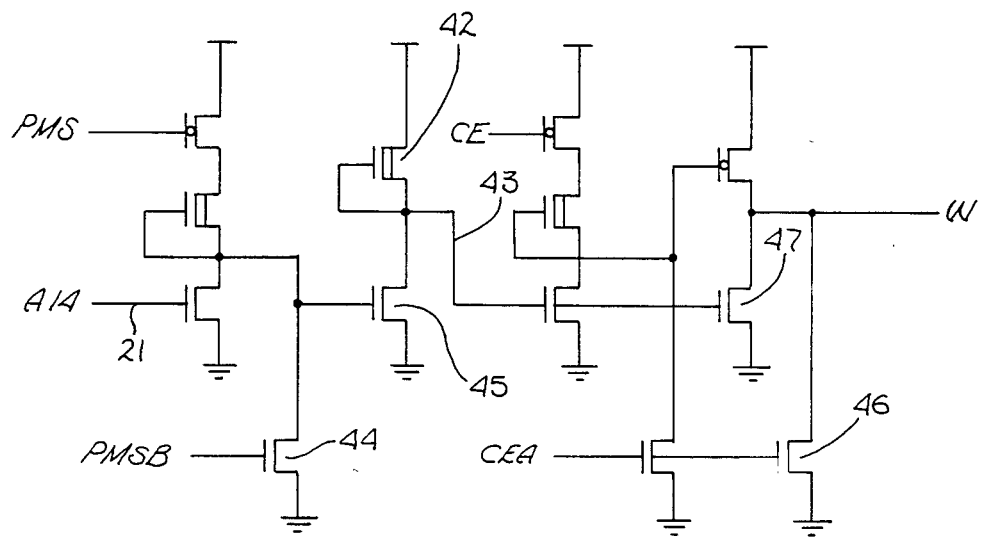
FIG. 3 is an electrical schematic of the write enable buffer of FIG. 1.

Referring to FIG. 3, the write enable buffer accepts an input (at the gate of transistor 45) from the address line 21 if the PMS signal from the generator 19 of FIG. 1 is high and its complement is low. The buffer receives the chip enable (CE) signal and its complement. When the chip is not enabled, transistor 46 assures that the W signal line will be held at ground potential. When the page mode is not selected, transistor 44 conducts, bringing the gate of transistor 45 to ground. This causes transistor 42 to clamp line 43 to the power supply potential, thereby bringing the W signal line to ground through transistor 47.

If PMS is high and the chip is selected (CE high) the state of the W signal is controlled by the signal on line 21. If this signal is low, transistor 45 conducts, bringing line 43 to ground which in turn causes a high output signal from the buffer. When the signal on line 21 is high, transistor 45 does not conduct and this clamps the output line to ground through transistor 47.

SPECIAL ADDRESS BUFFER

Figure 4:
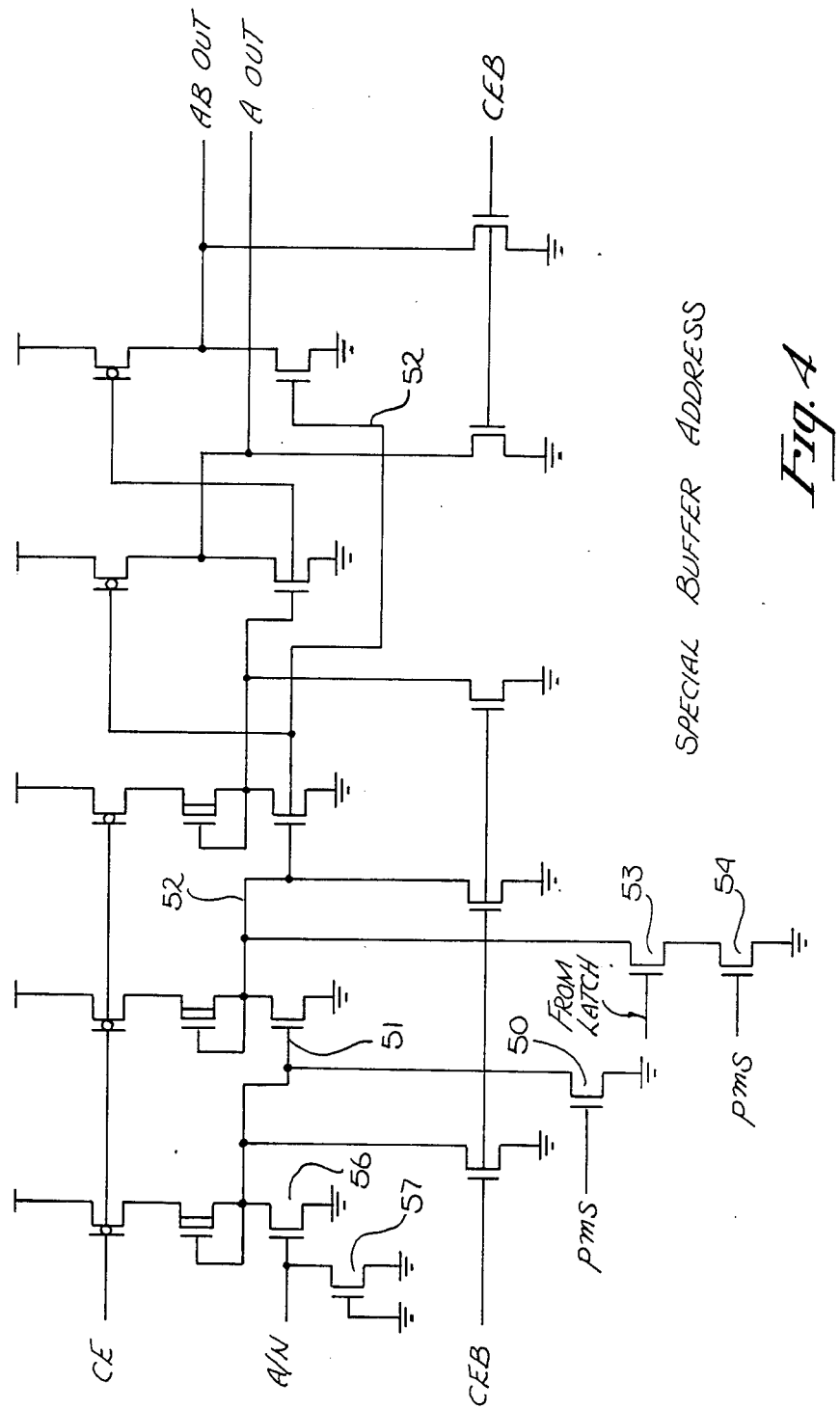
FIG. 4 is an electrical schematic of the address buffer of FIG. 1.

The buffer of FIG. 4 receives the input address signal at the gate of transistor 56. (Transistor 57 provides voltage protection by preventing breakdown of the gate of transistor 56.) If the memory is not selected, CEB is high and the output lines (both A OUT and its complement) are clamped to ground. Also the first three stages of the buffer are decoupled from the power supply potential and clamped to ground.

When the memory is enabled and the PMS signal is low, transistor 50 does not conduct. This allows the signal at the gate of transistor 56 to flow along line 51 and then onto line 52, thereby controlling the output signal of the buffer based on the state of the input signal $A_{IN}$. Note that since transistor 54 is not conducting the signal from the latch which is coupled to the gate of transistor 53 has no effect on the buffer at this time.

When the page mode is selected, line 51 is coupled to ground through transistor 50. This cuts off the signal from the address line. Under these conditions, and since transistor 54 is conducting, the output is controlled by the signal on the gate of transistor 53, that is, by the state of the latch 10 or 11 of FIG. 1.

PAGE MODE BIT STORAGE AND SIGNAL GENERATOR

Figure 5:
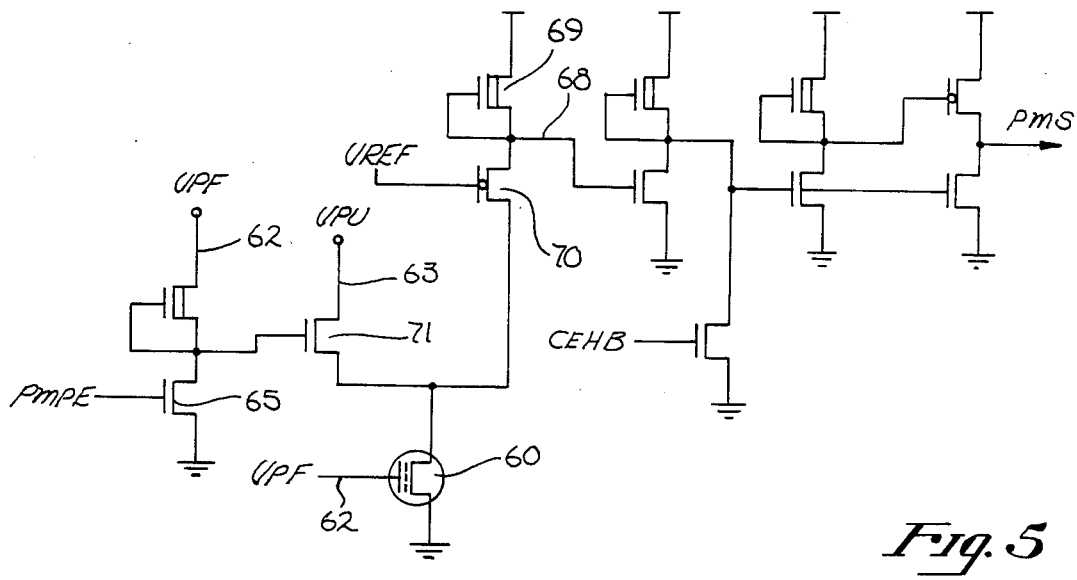
FIG. 5 is an electrical schematic of the programmable page mode (selection) bit storage means and page mode signal generator of FIG. 1.

Both the programmable storage bit 18 and page mode generator 19 of FIG. 1 are shown in FIG. 5. An EPROM cell 60 which is identical to the EPROMs used in the memory itself is used to store the bit which determines whether the page mode has been selected. Means for making a discretionary connection may be used in place of EPROM 60; for instance, a polysilicon fuse may be used to select the page mode.

In the presently preferred embodiment the EPROM 60 is programmed during manufacturing and shielded to prevent a user from erasing (and electrically isolated to prevent a user from programming), that is, the alternate page mode is selected at time of manufacture. The shield used over EPROM 60 is disclosed in application Ser. No. 398,415, filed June 17, 1982 now U.S. Pat. No. 4,519,050.

Assume first that the floating gate of EPROM cell 60 is erased. During operation of the memory the cell will then conduct, bringing line 68 to near ground potential. (The gate of transistor 70 receives a voltage reference potential used in the memory which causes this transistor to conduct.) This brings the output line (PMS signal) low. On the other hand, if the floating gate of the EPROM 60 is programmed, cell 60 does not conduct and line 68 is brought to the power supply potential through the depletion mode transistor 69. This causes the PMS signal to be high indicating that the page mode has been selected.

During programming of the memory bit, lines 62 and 63 are coupled to the higher programming potential. (During non-program operation (i.e., normal read-only operation), line 62 is coupled to the five volt power supply while line 63 is floating.) If a signal is present at the gate of transistor 65, this transistor conducts and prevents transistor 71 from conducting. This blocks the higher programming potential on line 63 from reaching the drain of cell 60 and thereby prevents the EPROM cell from program. In contrast, if no signal is present at the gate of transistor 65, transistor 71 conducts, causing the EPROM cell to program. Therefore, the signal at the gate of transistor 65 determines if the memory bit is to be programmed for ordinary memory operation or the alternate page mode addressing. The page mode program enable (PMPE) signal is generated by decoding signals coupled to terminals of the memory during programming, thereby eliminating the need for an additional pin for programming.

LATCH CLEAR CIRCUIT

Figure 6:
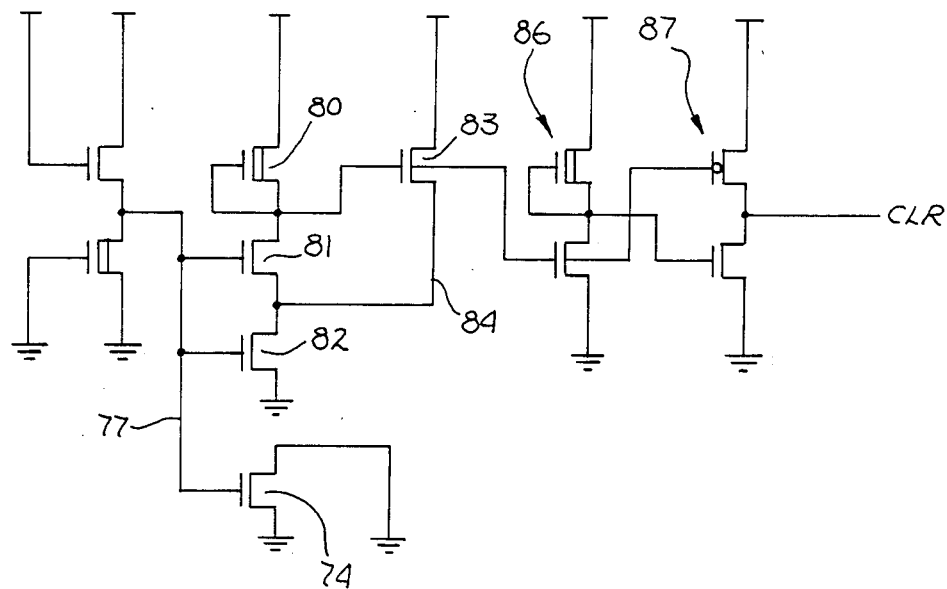
FIG. 6 is an electrical schematic of the latch clear circuit of FIG. 1.

The CLR signal from the circuit of FIG. 6, as previously discussed, sets the latches 10 and 11 of FIG. 1 in a predetermined state upon power up. Transistors 80, 81, 82 and 83 form a Schmidt trigger (feedback along line 84) which is triggered by VCC on line 77. When VCC reaches a predetermined potential buffer stages 86 and 87 cause the CLR signal to drop in potential. Capacitor 74 assures that if VCC rises quickly there will be a delay in the reaction of the Schmidt trigger. This delay is long enough for the latches 10 and 11 to be set.

Thus, a read-only memory has been described which includes an "on chip" apparatus for converting the memory from ordinary addressing to page mode addressing where the selecting of the page is done through data lines. A single manufactured part is thus able to fill two different requirements.

I claim:

1. In an integrated circuit, read-only memory having n address lines used for accessing p words in one addressing mode, an improvement for providing an alternate addressing mode, comprising:
   programmable selection means for selecting said alternate addressing mode;
   storage means for storing at least one signal;
   an address buffer coupled to one of said n address lines, said buffer also being coupled to said storage means and said programmable selection means, the output of said buffer being controlled by said signal stored in said storage means when said alternate addressing mode is selected,
   whereby when said alternate addressing mode is selected said p words in said memory may be selected with less than n address signals.

2. The improvement defined by claim 1 wherein said storage means is coupled to a data terminal of said memory.

3. The improvement defined by claim 2 including an enabling means for enabling a signal on said data terminal to be stored in said storage means, said enabling means being coupled to one of said n address lines.

4. The improvement defined by claims 1 or 3 including a circuit for storing a predetermined signal in said storage means when power is applied to said memory.

5. The improvement defined by claim 4 wherein said programmable selection means comprises an electrically programmable read-only memory cell.

6. The improvement defined by claim 5 wherein said storage means comprises a latch.

7. In an integrated circuit electrically programmable read-only memory having n address lines used for accessing p words stored in said memory in one addressing mode, an improvement for providing an alternate addressing mode, comprising:
   an electrically programmable read-only memory cell for selecting said alternate addressing mode;
   storage means for storing signals, said storage means being coupled to data terminals of said memory;
   address buffers coupled to said address lines, said buffers also being coupled to said storage means and said memory cell such that the output of said buffers is controlled by said signals stored in said storage means when said alternate address mode is selected,
   whereby when said alternate addressing mode is selected said p words in said memory may be addressed with less than n address signals.

8. The improvement defined by claim 7 including an enabling means for enabling storage of said signals in said storage means from said data terminals, said enabling means being coupled to one of said address lines.

9. The improvement defined by claim 8 including a circuit for storing predetermined signals in said storage means when power is applied to said memory.

10. The improvement defined by claim 9 wherein said storage means comprises latches.

* * * * *